United States Patent [19]

Sherman

[11] Patent Number: 5,426,558
[45] Date of Patent: Jun. 20, 1995

[54] ANTI-STICK ELECTROSTATIC CHUCK FOR A LOW PRESSURE ENVIRONMENT

[75] Inventor: Arthur Sherman, Palo Alto, Calif.

[73] Assignee: Varian Associates, Inc., Palo Alto, Calif.

[21] Appl. No.: 213,459

[22] Filed: Mar. 14, 1994

Related U.S. Application Data

[63] Continuation of Ser. No. 789,222, Jan. 7, 1991, abandoned.

[51] Int. Cl.⁶ .............................................. H02N 13/00
[52] U.S. Cl. ........................................ 361/234; 269/8; 269/903; 279/128
[58] Field of Search ...................... 361/230, 231, 235; 269/8, 903; 279/128

[56] References Cited

U.S. PATENT DOCUMENTS

| | | | |
|---|---|---|---|
| 4,480,284 | 10/1984 | Tojo et al. | 361/234 |
| 4,667,110 | 5/1987 | Kariya | 361/234 |
| 5,103,367 | 4/1992 | Horowitz et al. | 361/234 |
| 5,151,845 | 9/1992 | Watanabe et al. | 361/234 |
| 5,155,652 | 10/1992 | Logan et al. | 361/234 |
| 5,166,856 | 11/1992 | Liporace et al. | 361/233 |

Primary Examiner—Jeffrey A. Gaffin
Attorney, Agent, or Firm—Edward H. Berkowitz; Bella Fishman

[57] ABSTRACT

An electrostatic chuck for releasably holding a workpiece comprising a substrate formed by a pair of dielectric elements, each being a single crystal, with at least one electrode embedded therebetween, and a voltage source coupled to each electrode. The chuck is preferably fabricated from two substantially planar dielectric members sandwiched around a brazing compound which become electrodes after the assembly is heated and then cooled.

6 Claims, 3 Drawing Sheets

ANTI-STICK ELECTROSTATIC CHUCK FOR A LOW PRESSURE ENVIRONMENT

This application is a continuation of application Ser. No. 07/789,222, filed Jan. 2, 1991, now abandoned.

TECHNICAL FIELD

This invention pertains to the field of holding a workpiece, such as a semiconductor wafer, to a chuck in a low pressure environment by electrostatic forces, in such manner that when the electrostatic forces are removed, the workpiece does not adhere to the chuck.

BACKGROUND ART

"Electrostatic Chuck Patents—United States and Europe", 90100363A-GEN, Nov. 17, 1990 by Sematech, Inc. is a compilation of patent publications in this area. Items of particular interest are briefly discussed below:

U.S. Pat. No. 4,184,188 to Briglia appearing at page 58 of said compilation teaches the holding of a workpiece on a chuck by electrostatic forces without the need for electrical contact with the workpiece.

U.S. Pat. No. 4,384,918 to Abe appearing at page 62 of said compilation shows how the design of Briglia can be simplified by using twin semi-circular electrostatic plates for providing the electrostatic force.

European patent application O 138 254 appearing at page 229 of said compilation (particularly the passage on page 232 lines 20 and 21) indicates that it can take 24 hours for the electrostatic forces to dissipate sufficiently for a workpiece to be removed from an electrostatic chuck. The present invention overcomes this problem by virtue of permitting immediate removal of the workpiece 2 from the electrostatic chuck 4.

United Kingdom patent application 2 147 459 A, appearing at page 346 of said compilation, shows an air jet for releasing a workpiece from an electrostatic chuck.

PCT International Publication Number WO 88/09054, appearing at page 362 of said compilation, discloses (see claims 5 and 6) the use of sapphire and boron nitride substrates for an electrostatic chuck. This reference does not suggest that the reason for using sapphire and boron nitride is for their anti-stick properties (as in the present invention). We can assume it is not for their anti-stick properties, because this reference is limited to a.c. field excitation: the use of a.c. provides the anti-stick function. The only mention in the reference of the purpose for using such a substrate is the passage at p.4 lines 22–30, wherein it is stated that in a radio frequency etch apparatus, high electric fields are required to obtain strong holding forces; and good radio frequency power transfer through the chuck is also a requirement. In such a case, the substrate may be a ceramic, e.g., sapphire.

Note also the following additional references: U.S. Pat. Nos. Re. 32,024; 3,710,251; 4,473,455; 4,547,247; 4,623,839; 4,665,360; 4,666,291; and 4,953,287. U.S. Pat. No. 4,473,455 is illustrative of devices that use mechanical clamps to physically clamp the workpiece onto the chuck. This is undesirable because it wastes space on the workpiece, wastes time due to the requirement for periodic cleaning of the clamps, and can cause damage to the workpiece.

Also see Japanese patent publications 1-281835; 3-3249; 3-3250; and 59-4433; and European patent publication 0 107 323.

SUMMARY OF THE INVENTION

An electrostatic chuck for holding an electrically conductive workpiece onto the chuck in a low pressure environment. The chuck comprises a dielectric substrate for supporting the workpiece; embedded in the substrate, at least one electrically conductive electrode; and a voltage source coupled to each electrode. The dielectric substrate consists of a pair of dielectric plates, each plate is fabricated of a material not containing polar molecules that are free to move in response to energization of the voltage source.

BRIEF DESCRIPTION OF THE DRAWINGS

These and other more detailed and specific objects and features of the present invention are more fully disclosed in the following specification, reference being had to the accompanying drawings, in which.

DESCRIPTION OF THE PREFERRED EMBODIMENTS

Figure 1:
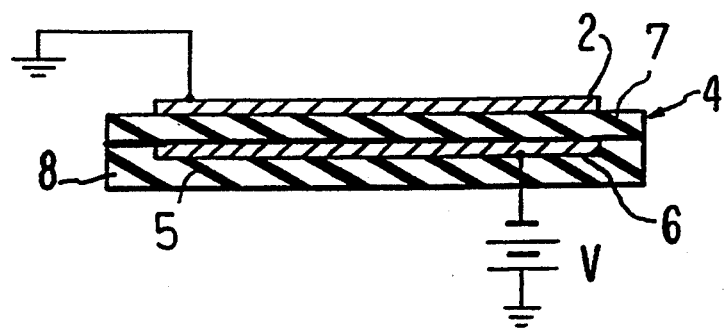
FIG. 1 is a side cross-sectional view of a first embodiment of the present invention.

FIG. 1 illustrates a first embodiment of the present invention in which workpiece 2 is held onto an upper surface of electrostatic chuck 4. Chuck 4 is formed by substrate 8, which comprises first dielectric plate 5 and second dielectric plate 7, each forming a single crystal. Workpiece 2 is any electrical conductor or semiconductor, such as a silicon wafer. Workpiece 2 is typically the precursor of an integrated circuit, a flat panel liquid crystal display layer, or a wafer to be subjected to electron beam lithography. Chuck 4 serves to hold workpiece 2 in a low pressure environment, such as a reactive ion etcher, sputtering reactor, or chemical vapor deposition (CVD) reactor. Chuck 4 may serve as an electrostatic wafer pick, i.e., for transporting the workpiece 2 from one location to another. By a "low pressure" environment is meant an environment in which the pressure is less than 50 Torr. At such low pressures, electrostatic forces are very useful in holding the workpiece 2 to the chuck 4. These forces prevent the dislocation of the workpiece 2 caused by environmental factors such as processing gas pressures. For such an electrostatic chuck 4, workpiece 2 is used as one plate of a capacitor. One of the problems with such an electrostatic chuck is that the workpiece tends to adhere (stick) to the chuck after the removal of the electrostatic force. This problem is overcome by the present invention by providing the chuck made of a pair of single crystal dielectric elements mounted contiguously and coextensively with at least one electrode embedded therebetween so as to form a substrate with polar molecules that are not free to move in response to the electric field.

In the FIG. 1 embodiment a lower surface of second dielectric plate 7 is adjacent coextensively to an upper surface of first dielectric plate 5. First dielectric plate 5 has a recess where, the second plate 6 of the capacitor is embedded therewith and is coupled to a voltage source V while workpiece 2 being a first plate of capacitor, is grounded. When voltage V is applied to this capacitor, there is a force pulling electrodes 2,6 together. The force holding workpiece 2 onto the face of chuck 4 is proportional to the square of the electric field applied.

Figure 2:
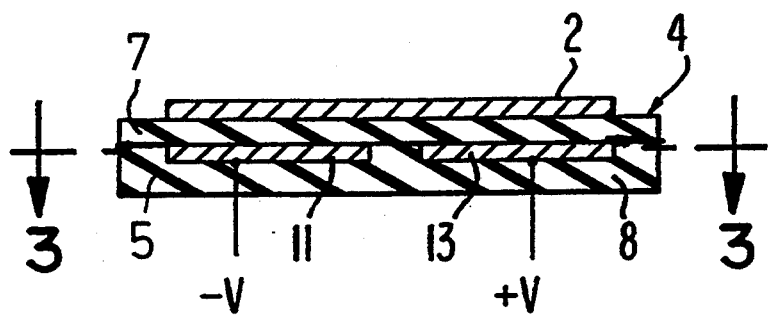
FIG. 2 is a side cross-sectional view of a second embodiment of the present invention.
Figure 3:
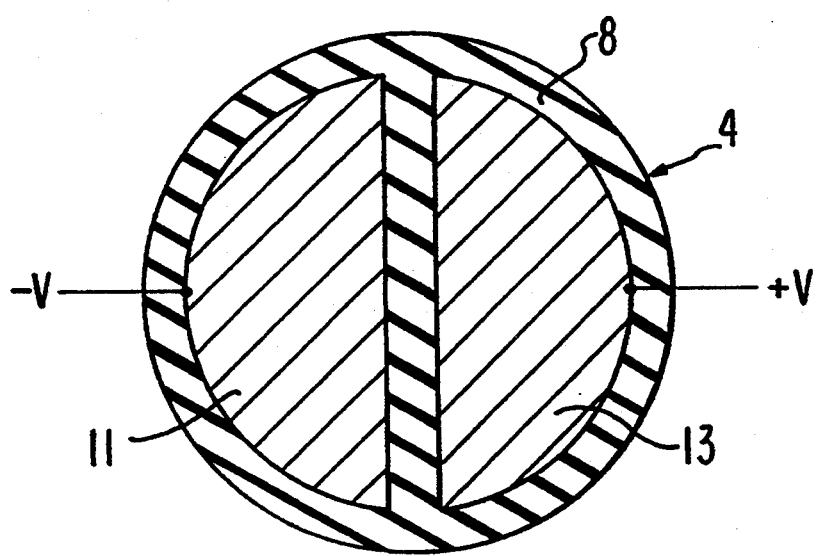
FIG. 3 is a planar view taken along view lines 3—3 of the embodiment of the present invention illustrated in FIG. 2.

FIGS. 2 and 3 illustrates a second embodiment of the present invention in which two electrodes 11,13 rather than one are embedded in substrate 8 between dielectric plates 5 and 7. Plate 5 has a pair of recesses to accommodate electrodes 11 and 13. In this embodiment, there is no need to ground workpiece 2. This avoids the problem of forming electric contact with workpiece 2, which is problematical because the build-up of insulative coating on the workpiece 2 (e.g., silicon oxide in the case where workpiece 2 is fabricated of silicon) makes such an electrical contact difficult and because of the danger of chipping workpiece 2.

Electrodes 11,13 have substantially the same size and are coupled, respectively, to a −V voltage source and a +V voltage source. This forces workpiece 2 to be at ground potential because of symmetry. V is typically approximately 2,000 volts d.c. Using an experimental chuck 4, we have measured forces as large as 5 pounds on a wafer 2 having a diameter of 3 inches. This is the equivalent of 34 Torr pressure holding wafer 2.

The voltage source V can be a.c. or d.c. (alternating current or direct current). For the applications of the etcher and the wafer pick, a.c. is adequate for overcoming the problem of workpiece 2 sticking to chuck 4. For the etcher, the temperature typically is not above 200° C., and dielectric 8 can be plastic.

For a low pressure CVD process, where the temperature can range up to 600° C., it is important to use d.c., because a.c. can cause unwanted "chatter", or periodic breaking of the vacuum seal between workpiece 2 and chuck 4. Chatter is not usually a problem for the wafer pick application.

As we have seen from the Background Art section, workpiece 2 can stick to chuck 4 for as much as 24 hours, which wastes processing time. This sticking is caused by the formation of electrets: if there are movable polar molecules within substrate 8, the presence of the strong electric field V causes some of the polar molecules to align with the field by rotation in situ. This results in a permanent electrostatic force, similar to when magnetic materials are magnetized. By a "polar molecule" is meant one in which there is an asymmetric distribution of electrons within the molecular structure.

The present invention solves the sticking problem by using a substrate 8 that does not contain polar molecules that are free to move in response to the electric field V. Thus, in the present invention substrate 8 consists of either a substance which does not have polar molecules or a substance which does have polar molecules but ones which aren't free to move because the substance is a single crystal. A second requirement for dielectric 8 is that it have a high breakdown field strength, i.e., it can withstand the relatively high voltages V without breaking down internally. Additionally, for high temperature application, a third requirement is that substrate 8 should be a ceramic material, such as quartz or alumina.

An example of a material not having polar molecules and suitable for substrate 8 is diamond, e.g., polycrystalline diamond grown by low pressure CVD. Examples of suitable materials that can be fabricated as single crystals are boron nitride (with a dielectric constant of 4) and aluminum oxide (having a dielectric constant of 8). Aluminum oxide ($Al_2O_3$), is particularly suitable because it has a relatively high dielectric constant, is commercially available, and has a relatively high melting point of 2300° C. The aluminum oxide may have a blue impurity (sapphire) or a red impurity (ruby). Other materials that are suitable for substrate 8 are quartz ($SiO_2$), magnesium oxide, etc.

Figure 4:
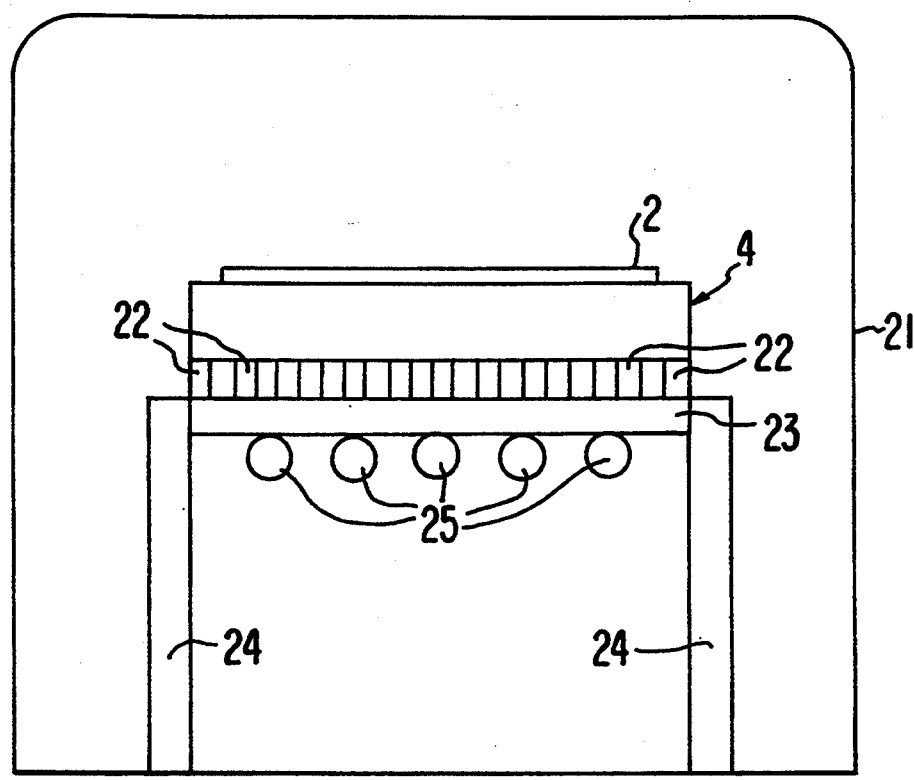
FIG. 4 is a sketch showing the placement of an electrostatic chuck 4 of the present invention on a heater assembly 25 inside a vacuum chamber 21.

FIG. 4 illustrates the placement of dielectric chuck 4 in vacuum chamber 21 in an application where heat must be applied to chuck 4. Chuck 4 can be any dielectric chuck, not necessarily one illustrated in FIGS. 1–3. Heating to relatively high temperatures such as 600° C. is often necessary or desirable for certain processes such as low pressure chemical vapor deposition. In such an application, heat must be applied to workpiece 2 via chuck 4. This is typically done via heating element 25 and metallic plate 23. In such an apparatus, there is a problem of matching the coefficient of thermal expansion of metal heating element 25 with that of dielectric chuck 4. A technique that has been proven to be very useful is to use a plurality of metallic pins 22 between the metallic plate 23 and dielectric chuck 4. Pins 22 transfer enough heat from plate 23 to dielectric chuck 4, yet are flexible to account for motion caused by differences in the thermal expansion coefficient between plate 23 and dielectric chuck 4 as workpiece 2 is heated and then cooled. Pins 22 are adhered to the lower surface of dielectric chuck 4, e.g., by brazing using an active brazing alloy (ABA). A suitable active brazing alloy is one containing silver, copper, and titanium, and having a melting point of between 600° C. and 750° C.

Most metals are suitable for plate 23. Particularly good choices are Kovar and a titanium alloy such as one containing molybdenum, because these have good matches in thermal expansion coefficient to dielectric chuck 4 when dielectric 4 is fabricated of sapphire. Support pedestals 24 serve to elevate plate 23 and heating element 25 above the floor of vacuum chamber 21.

The bottoms of pins 22 can be welded or brazed to the upper surface of plate 23, or machined or cut therefrom, e.g., using a milling machine, The preferred manner of forming pins 22 is to machine them out of the top surface of plate 23 as illustrated in FIG. 6.

Figure 6A:
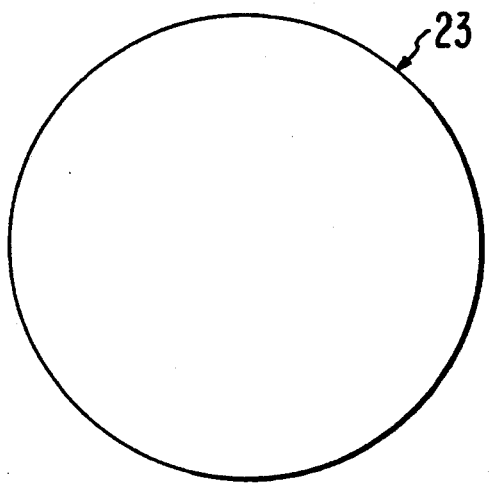
FIGS. 6(a–e) is a series of five sketches showing the manufacture of a metal plate 23 suitable for coupling an electrostatic chuck 4 of the present invention to a heater 25.
Figure 6B:
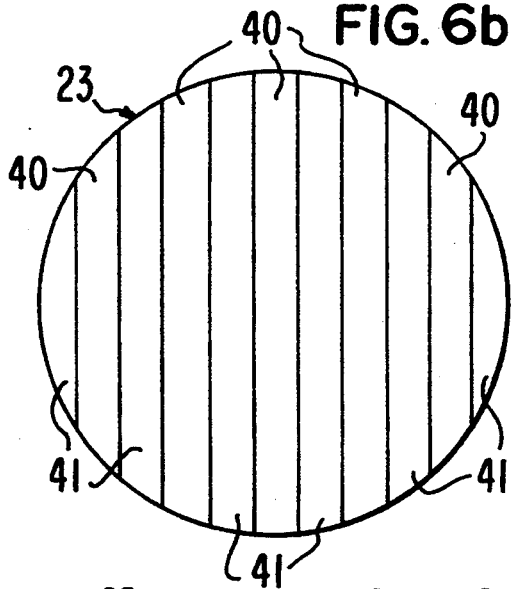
Figure 6C:
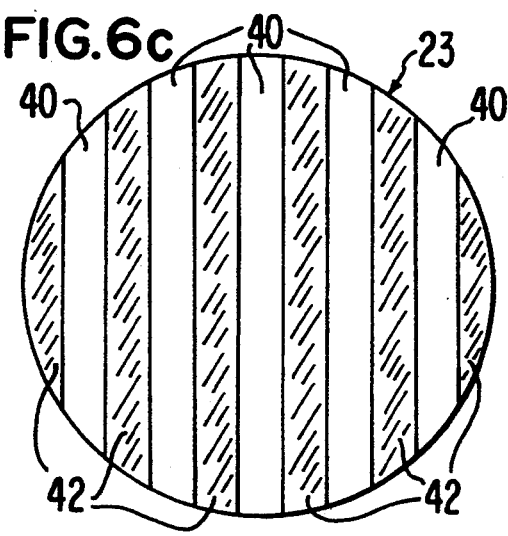
Figure 6D:
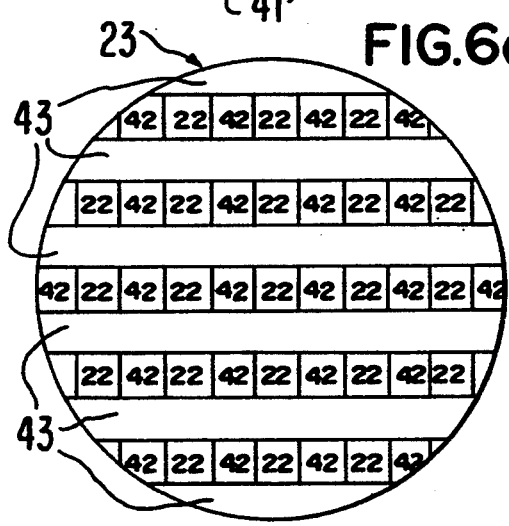
Figure 6E:
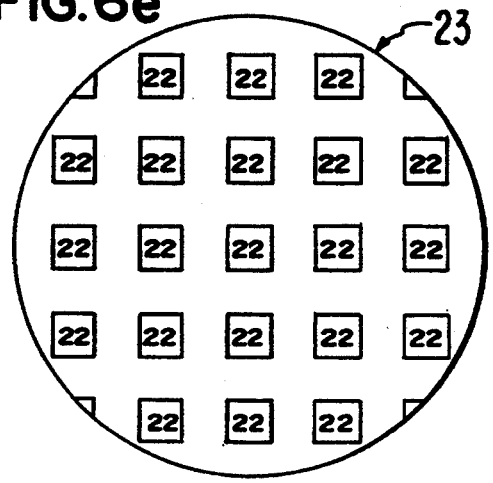

FIG. 6(a) shows the top surface of metal plate 23. First, it is necessary to machine or cut a first set of generally parallel grooves 41 in said surface, as illustrated in FIG. 6(b). This creates a set of generally parallel raised ridges 40. The next step is to fill grooves 41 with a rigid retainer material 42 such as a hard plastic, as illustrated in FIG. 6(c). The purpose of retainers 42 is to prevent the breaking of the ridges 40 when generally perpendicular cuts are made to form a second set of generally parallel grooves 43 in said surface, as illustrated in FIG. 6(d). The final step is to remove the remaining pieces of retainer material 42, thereby forming a set of protruding pins 22 as illustrated in FIG. 6(e).

A preferred embodiment for making electrostatic chuck 4 is illustrated in FIG. 5. This chuck may or may not be chuck 4 of the type depicted in FIGS. 1-3. For purposes of illustration only, chuck 4 of the FIG. 2-3 variety is shown. In this method, lower dielectric element 30 and upper dielectric element 33 are used. Lower dielectric 30 should be thicker than upper dielectric 33. Lower dielectric 30 needs to be relatively thick for purposes of mechanical support and to avoid the bowing of workpiece 2 in applications where heating is involved. (This latter reason also requires that metal plate 23 be relatively thick as well.) Upper dielectric 33 must be relatively thin because of the need to maximize the electrostatic forces pulling on workpiece 2. The trade-off is that if upper dielectric 33 is made to be too thin, it could crack, which would lead to undesirable arcing. For a sapphire dielectric 33, a desirable thickness is between 5 mils and 10 mils. To achieve this thin of a layer, lapping rather than grinding is called for.

Figure 5A:
FIGS. 5(a–d) illustrates a series of four steps in the manufacture of an electrostatic chuck 4 of the present invention.
Figure 5B:
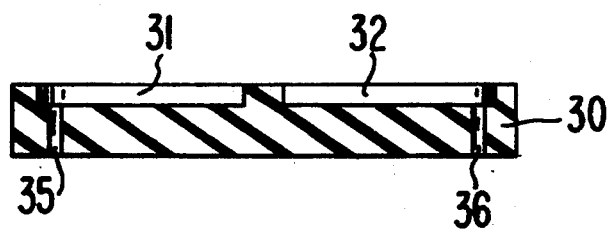

FIG. 5(b) illustrates a preferred embodiment, in which recesses 31,32 are ground or lapped out of the upper surface of lower dielectric 30. Holes 35,36 are drilled through dielectric 30 into recesses 31,32, respectively, to accommodate means for coupling electrodes 11,13 to voltage sources −V and +V.

Figure 5C:
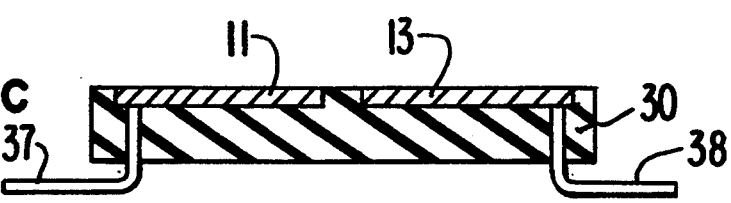
Figure 5D:
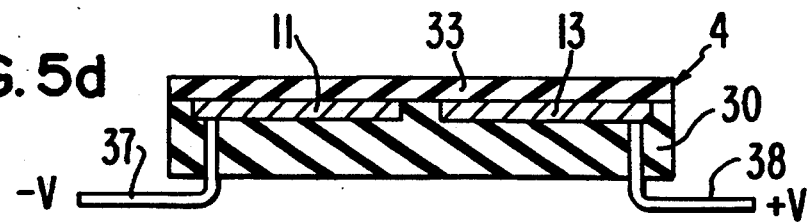

Recesses 31,32 are filled with brazing compound 11,13, as illustrated in FIG. 5(c). This brazing compound can be the same as that described above to adhere pins 22 to dielectric chuck 4. Holes 35,36 can either be filled with brazing compound or, as illustrated in FIG. 5(c), support the ends of wires 37,38 which are electrically connected to patches 11,13 of brazing compound, respectively, and protrude downwardly from dielectric 30.

Upper dielectric 33 is then placed onto the assembly of FIG. 5(c) and the new assembly is heated above the melting point of the brazing compound. Upon cooling, surfaces 30 and 33 are brazed together, and electrodes 11,13 are automatically formed. Wires 37,38 are then connected to voltage sources −V and +V, respectively.

The recess formation step of FIG. 5(b) is optional, i.e., the brazing compound can be spread directly on the upper surface of dielectric 30 to form one or more patches. Forming recesses 31,32, however, eliminates the air gap that would otherwise form between dielectrics 30,33. This air gap could contain undesirable impurities.

In an alternative embodiment, wires 37,38 can be formed to protrude from electrodes 11,13 outwardly rather than downwardly.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. An electrostatic chuck for holding an electrically conductive workpiece on the chuck in a low pressure environment, said chuck comprising:
   a substrate comprising first and second dielectric plates,
   said first dielectric plate having an upper and lower surface, said upper surface having at least one recess formed thereon, said first dielectric plate forming a single crystal;
   at least one electrode, said electrode placed within said recess of said first dielectric plate;
   said second dielectric plate having an upper surface for supporting the workpiece and a lower surface, said second dielectric plate forming a single crystal, said second dielectric plate mounted by its lower surface contiguously and coextensively to the upper surface of said first dielectric plate;
   a voltage source for applying a voltage to at least one of said electrodes; and means for coupling at least one of said conductive electrodes to said voltage source.

2. The chuck of claim 1, wherein said first dielectric plate is thicker than said second dielectric plate.

3. The chuck of claim 2, wherein said first dielectric plate further comprises at least one opening extending through the lower surface of said first plate into said recess for accommodating said means for coupling said electrode to said voltage source.

4. The chuck of claim 1 wherein the substrate is fabricated of a material from the group of materials comprising quartz and magnesium oxide.

5. The chuck of claim 1 wherein a single electrically conductive electrode is embedded in the substrate, and the workpiece is coupled to ground.

6. The chuck of claim 1 wherein there are two electrically conductive electrodes embedded within the substrate: a first electrode coupled to a voltage of +V and a second electrode coupled to a voltage of −V.

* * * * *